United States Patent
McGuire, Jr.

(10) Patent No.: US 6,573,978 B1
(45) Date of Patent: Jun. 3, 2003

(54) EUV CONDENSER WITH NON-IMAGING OPTICS

(76) Inventor: James P. McGuire, Jr., 1720 Kaweah Dr., Pasadena, CA (US) 91105

(*) Notice: Subject to any disclaimer, the term of this patent is extended or adjusted under 35 U.S.C. 154(b) by 0 days.

(21) Appl. No.: 09/236,888

(22) Filed: Jan. 26, 1999

(51) Int. Cl.$^7$ .................. G03B 27/72; G03B 27/54; G02B 17/00; G02B 5/10
(52) U.S. Cl. ............... 355/71; 355/67; 359/366; 359/859
(58) Field of Search ................ 359/350, 359, 359/365, 366, 434, 727, 730, 731, 858, 861, 851, 627, 428, 900, 351; 430/270.1; 355/45, 49, 67, 57, 60, 65, 66, 71; 378/34, 35; 302/298

(56) References Cited

U.S. PATENT DOCUMENTS

| | | | |
|---|---|---|---|
| 5,237,170 A | * 8/1993 | Shatz | 250/216 |
| 5,339,346 A | 8/1994 | White | 378/34 |
| 5,361,292 A | 11/1994 | Sweatt | 378/34 |
| 5,512,759 A | 4/1996 | Sweatt | 250/492.1 |
| 5,581,605 A | * 12/1996 | Murakami et al. | 378/34 |
| 5,631,721 A | 5/1997 | Stanton et al. | 355/71 |
| 5,677,939 A | 10/1997 | Oshino | 378/34 |
| 5,815,310 A | 9/1998 | Williamson | 359/365 |
| 5,836,667 A | * 11/1998 | Baker et al. | 362/32 |
| 6,118,577 A | * 9/2000 | Sweatt et al. | 359/351 |
| 6,162,577 A | * 12/2000 | Felter et al. | 430/270.1 |
| 6,195,201 B1 | * 2/2001 | Koch et al. | 359/366 |

FOREIGN PATENT DOCUMENTS

EP 0 939 341 A2 9/1999
EP 0 955 641 A1 11/1999

OTHER PUBLICATIONS

Jenkins and Winston, Tailored Reflectors for Illuminators, Apr. 1, 1996, Applied Optics vol. 35, No. 10, pp. 1669–1671.
O. Kusch, Computer–Aided Optical Design Of Illuminating and Irradiating Devices, 1993, Chapter 3, pp. 145–173.
Schruben, Formulation of a Reflector–Design Problem for a Lighting Fixture, Dec. 1972, Journal of the Optical Society of America, vol. 62, No. 12, pp. 1498–1501.

* cited by examiner

Primary Examiner—Russell Adams
Assistant Examiner—Peter B. Kim
(74) Attorney, Agent, or Firm—Sterne, Kessler, Goldstein & Fox, P.L.L.C.

(57) ABSTRACT

An illumination system and condenser for use in photolithography in the extreme ultraviolet wavelength region having a first non-imaging optic element collecting electromagnetic radiation from a source and creating a desired irradiance distribution and a second non-imaging optic element receiving the electromagnetic radiation from the first non-imaging optic element and redirecting and imaging the electromagnetic radiation. The electromagnetic radiation emanating from the second non-imaging optic element is suitable for being received by other conventional optical surfaces to provide a desired irradiance distribution with a desired angular distribution and desired shape. Facets are used to provide the desired illumination over the desired illumination field. Reflective facets may be placed on the second non-imaging optic, which can reduce the number of mirrors and increase efficiency. The illumination system may be used in combination with a projection optic to project the image of a reticle or mask onto a photosensitive substrate, such as a semiconductor wafer.

33 Claims, 13 Drawing Sheets

EUV CONDENSER WITH NON-IMAGING OPTICS

FIELD OF THE INVENTION

The present invention relates generally to a condenser and illumination systems for projecting the image of a reticle onto a photosensitive substrate as used in photolithography in semiconductor manufacturing, and more particularly to a condenser suitable for use in the extreme ultraviolet or soft X-ray wavelengths having non-imaging optics forming a desired irradiance and desired angular distribution.

BACKGROUND OF THE INVENTION

Photolithography is often used in the manufacture of many devices and in particular, electronic or semiconductor devices. In a photolithographic process, the image of a reticle or mask is projected onto a photosensitive substrate. As the element or feature size desired to be imaged on the photosensitive substrate becomes ever smaller, technical problems often arise. One of these problems is illuminating the reticle or mask so that its image can be projected onto the photosensitive substrate. As the element or feature size of semiconductor devices become ever smaller, there is a need for photolithographic systems providing a resolution of less than 0.13 micrometers. In order to achieve the imaging of these relatively small element or feature sizes, shorter wavelengths of electromagnetic radiation must be used to project the image of a reticle or mask onto the photosensitive substrate. Accordingly, it is necessary for photolithographic systems to operate at the extreme ultraviolet wavelengths, below 157 nanometers, and into the soft X-ray wavelengths, around 1 nanometers. Additionally, projection optics having the required resolution and imaging capabilities often result in utilization of a portion of a ring field. One such projection optic system used in photolithography is disclosed in U.S. Pat. No. 5,815,310 entitled "High Numerical Aperture Ring Field Optical Reduction System" issuing to Williamson on Sep. 29, 1998, which is herein incorporated by reference in its entirety. While the projection optic system disclosed therein can achieve a working resolution of 0.03 microns, there are few illumination sources or illumination systems that can provide the required illumination properties for projecting the image of the reticle or mask onto the photosensitive substrate. An illuminating system is disclosed in U.S. Pat. No. 5,339,346 entitled "Device Fabrication Entailing Plasma-Derived X-Ray Delineation" issuing to White on Aug. 16, 1994. Therein disclosed is a condenser for use with a laser-pumped plasma source having a faceted collector lens including paired facets, symmetrically placed about an axis. Another illumination system is disclosed in U.S. Pat. No. 5,677,939 entitled "Illuminating Apparatus" issuing to Oshino on Oct. 14, 1997. Therein disclosed is an illumination system for illuminating an object in an arcuate pattern having a reflecting mirror with a parabolic-toric body of rotation in the reflection type optical integrator having a reflecting surface for effecting the critical illumination in the meridoinal direction and a reflecting surface for effecting the Kohler illumination in the sagittal direction. Another illuminating system is disclosed in U.S. Pat. No. 5,512,759 entitled "Condenser For Illuminating A Ring Field Camera With Synchrotron Emission Light" issuing to Sweatt on Apr. 30, 1996, which is herein incorporated by reference in its entirety. Therein disclosed is a condenser comprising concave and convex spherical mirrors that collect the light beams, flat mirrors that converge and direct the light beams into a real entrance pupil of a camera, and a spherical mirror for imaging the real entrance pupil through the resistive. mask and into the virtual entrance pupil of the camera. Another illumination system is disclosed in U.S. Pat. No. 5,361,292 entitled "Condenser For Illuminating A Ring Field" issuing to Sweatt on Nov. 1, 1994. Therein disclosed is a condenser using a segmented aspheric mirror to collect radiation and produce a set of arcuate foci that are then translated and rotated by other mirrors so that all the arcuate regions are superposed at the mask.

However, these prior illumination systems may not provide the desired illumination and are relatively complicated. Additionally, many of these systems are relatively large, having many surfaces resulting in loss of energy. Some are also difficult to align and may require adjustment.

Accordingly, there is a need for an improved illumination system and condenser for use in the extreme ultraviolet that provides a desired irradiance over a predetermined field or area with a desired irradiance and angular distribution for use in photolithography.

SUMMARY OF THE INVENTION

The present invention is directed to an illumination system comprising a condenser having non-imaging optic elements. A first non-imaging optic element is used to collect light from a source and create a desired or predetermined irradiance distribution. A second non-imaging optic element receives electromagnetic radiation from the first non-imaging optic element and redirects the electromagnetic radiation into collimated nearly spherical or flat wavefronts. Facets placed at the pupil of the illumination system shapes the electromagnetic radiation and provides uniform illumination over a desired area. The facets may be provided on the second non-imaging optic element. Additional objective optics may be utilized to further-process the electromagnetic radiation or to relay the electromagnetic radiation to the desired area at a reticle or mask, the image of which is projected onto a photosensitive substrate.

Accordingly, it is an object of the present invention to provide a desired irradiance over a predetermined field or area.

It is a further object of the present invention to provide a predetermined angular and irradiance distribution.

It is yet a further object of the present invention to increase the étendue of a source of electromagnetic radiation.

It is an advantage of the present invention that it is an efficient condenser for the desired wavelength.

It is a further advantage of the present invention that it is relatively compact.

It is a feature of the present invention that non-imaging optic elements are used.

It is another feature of the present invention that a relatively small number of reflective surfaces are utilized.

It is yet a further feature of the present invention that a faceted optic element is used.

These and other objects, advantages, and features will be readily apparent in view of the following detailed description.

DETAILED DESCRIPTION OF THE PREFERRED EMBODIMENTS

Figure 1:
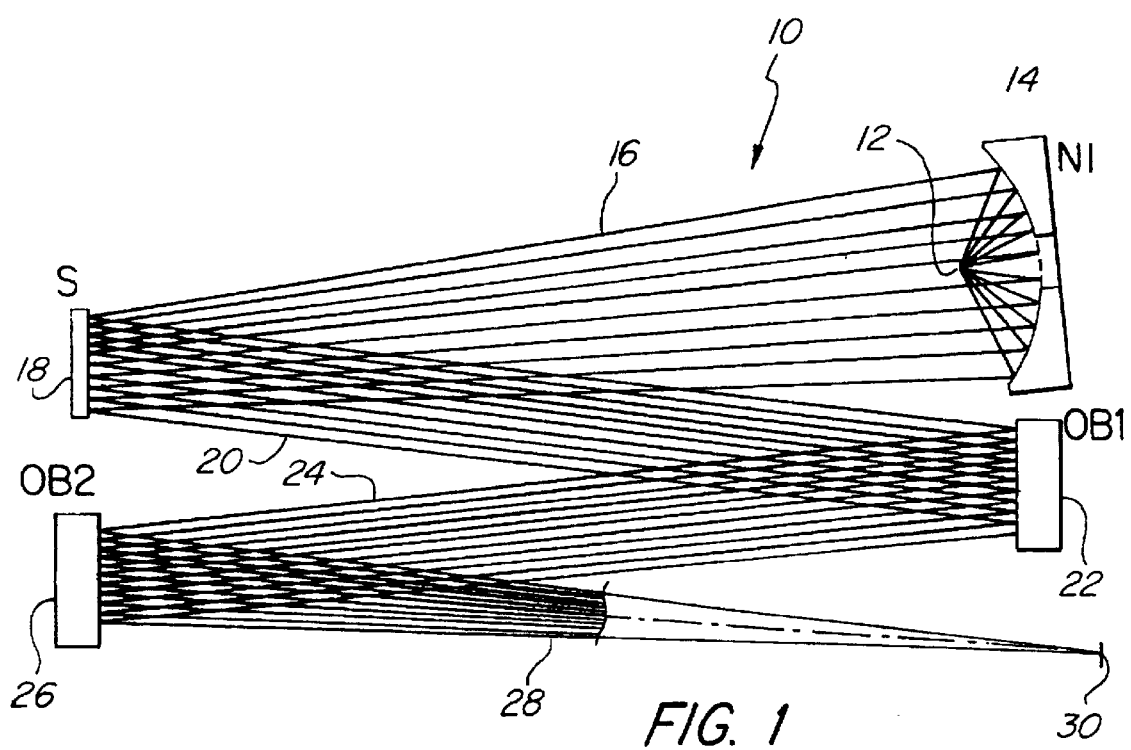
FIG. 1 schematically illustrates the illumination system of the present invention.

FIG. 1 schematically illustrates the illumination system 10 of the present invention utilizing non-imaging optics. An extreme ultraviolet radiation, EUV, source 12, which may be a laser plasma source, a capillary discharge tube or synchrotron, provides electromagnetic radiation in the extreme ultraviolet to a non-imaging optic element 14. The collector or first non-imaging optic element 14 collects the electromagnetic radiation from the source and creates a desired or predetermined radiance distribution in the pupil of the illumination system 10. The radiance distribution may be uniform, annular, quadruple or other known or desired radiance distribution. Various radiance distributions have known desirable properties for imaging different patterns onto a photosensitive substrate. Coatings having a graded thickness profile may be place on the first non-imaging optic element 14 to improve reflectivity. The electromagnetic radiation reflected from the first non-imaging optic element 14 is collected by a shaper or second non-imaging optic element 18. The pupil of the illumination system 10 is located near or adjacent the second non-imaging optic element 18. Entering rays 16 are reflected from the second non-imaging optic element 18 and exit as emerging rays 20. The non-imaging optic element 18 redirects and collimates the electromagnetic radiation, illustrated as rays 20, into nearly spherical or flat wavefronts. This allows the use of conventional optical surfaces to be used in the remainder of the illumination system 10. The second non-imaging optic element 18 may have a plurality of facets placed thereon providing uniform illumination over a desired area or illumination field. The facets are placed at the pupil, adjacent the second non-imaging optic element 18, of the illumination system 10. Electromagnetic radiation, illustrated by rays 20, is reflected from the second non-imaging optic element 18 and received by a conventional optical element 22. Electromagnetic radiation is reflected from optical element 22, illustrated by rays 24, and received by a second conventional optical element 26, which in turn is reflected as rays 28 to illuminate a reticle 30. The optical elements 22 and 26 may be conventional objective optical elements. For example, optical element 22 may correct for coma and be relatively flat. Optical element 26 may be an oblate spheroid. The optical elements 22 and 26 are preferably anamorphic aspheres and are designed to image light reflected or scattered by the second non-imaging optical element 18 onto a reticle and into the entrance pupil of projection optics. The anamorphic departures are used to maintain a constant round pupil across a reticle. Optical elements 22 and 26 may relay or image illumination to the entrance pupil of the projection optic.

This illumination fills the pupil with a predetermined irradiance and angular distribution, which is referred to as pupil fill. The present invention permits the pupil fill to be modified as desired to enhance the imaging of a pattern on a reticle. Generally, desirable pupil fills are well known, or can be determined relatively easily with a test reticle. Pupil fill or angular distribution may be more precisely identified by the radiometric term radiant intensity, which is commonly expressed in Watts per steradian. Lithographers often use pupil fill to describe this quantity. However, confusion can arise because the irradiance distribution at the pupil is sometimes also called the pupil fill. It is important to realize that the radiant intensity looking back from the reticle or mask from each field point will not necessarily be the same as the irradiance in the pupil. An example is if irradiance distribution were uniform, but the right half of the reticle or mask had a radiant intensity which was the right half of a circle and the left half of the mask had a radiant intensity which was the left half of a circle.

Additionally, the present invention makes possible the illumination of a desired area on a reticle or mask, such as an arcuate, rectangle, or other shaped area. The present invention also provides a desired irradiance distribution, with a uniform irradiance distribution usually desired, but may provide for a different profile or irradiance distribution if desired. The present invention also provides an illuminated region that is effectively self-luminous. Additionally, each point in the illumination region is illuminated by the same desired angular spectrum, whether it is uniform, annular, quadrupole, or other desired distribution. The present invention also provides that the exit pupil for each point in the illumination region is in the same location to prevent telecentricity errors.

The first non-imaging optic element 14 collects electromagnetic radiation from the source 12. The combination of the first and second non-imaging optic elements 14 and 18 forms the desired irradiance distribution at the illumination system 10 or condenser pupil and forms an image of the source 12. The second non-imaging optic element 18, functioning as a beam shaper. The beam shaper located at the pupil of the illumination system 10 or condenser scatters the incident radiation so that the image of the source fills the desired region of the reticle or mask 30. Each point of the reticle or mask 30 receives light or electromagnetic radiation from a large number of discrete points in the pupil. The discrete points may number in the millions depending upon the size of the facets 34 on the second non-imaging optic element 18. While the pupil is not completely filled, because the source étendue is less than that accepted by the projection optics, the pupil fill is more uniform than can be obtained using conventional segmented optics. Conventional optical elements limits the condenser to fill with only tens of points or lines in the pupil. The improved pupil fill, of the present invention, is achieved by manufacturing the second non-imaging optic element 18 with many individual facets using lithography and a gray scale mask.

The illumination system or condenser is effectively a critical condenser with a non-imaging optic element 18 or beam shaper at the stop to distribute the photons in a desired fashion across the reticle or mask 30. In the preferred embodiment, the stop is at the second non-imaging optic element 18, which serves simultaneously as a beam shaper and to re-image the source at infinity. Combining these two functions on the second non-imaging optic element 18 reduces the number of optics in the illumination system and improves system throughput.

Figure 2:
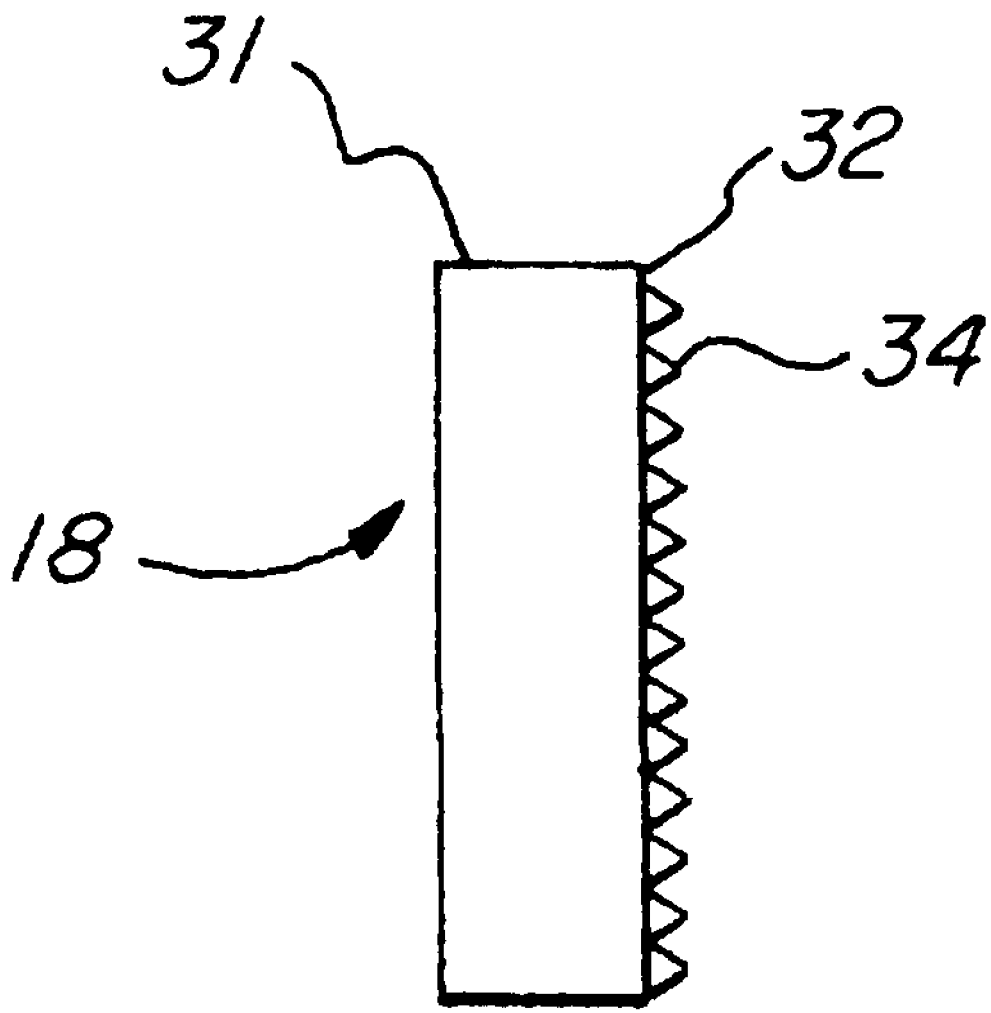
FIG. 2 schematically illustrates optical element 18 illustrated in FIG. 1.

FIG. 2 more clearly illustrates the second non-imaging optic element 18. Preferably, facets 34 are formed on the base surface 32 of base 31. It should be appreciated that the facets 34 have been greatly exaggerated in size and tilt for illustrative purposes. The facets 34 are shaped and tilted such that the angular spectrum reflected from the non-imaging optic element 18 forms the predetermined or desired shape or illumination field at the reticle or mask when imaged by the optical elements 22 and 26, illustrated in FIG. 1. Facets 34 are chosen so that the angular spectrum produces an arcuate region when imaged. Diffraction from the facets will increase the étendue. Facets 34 should be small enough to provide reticle plane uniformity, and large enough to minimize edge scattering. For example, a one hundred and twenty millimeter diameter or dimension non-imaging optical element may have ten micrometer dimension facets. This provides good uniform illumination and pupil fill. The facets may be reduced in size to at least four micrometers. The facets 34 may preferably form a Fresnel surface.

The beam shaper or second non-imaging optical element 18 receives electromagnetic radiation or light from the collector or first non-imaging optical element 14 and redirects it over the desired illumination field. Conceptually, this can be divided into two separate tasks: reimaging of the source 12 which is accomplished by the base surface 32 and blurring the source image over the illumination field which is accomplished by engineering a scattering surface composed of many small facets 34.

The combination of the collector or first non-imaging optical element 14 and the beam shaper or second non-imaging optical element 18 surfaces reimages the source, at finite or infinite conjugates. The shaper base surface 32 is determined by 1) solving the differential equations that define the collector or first non-imaging optical element 14, 2) calculating the angle of incidence of the rays θ at the beam shaper surface, and 3) calculating the slope of the shaper surface necessary to redirect the incident radiation towards a finite or an infinite conjugate. The slopes of the shaper surface may be integrated to give the surface profile or the slopes may be directly integrated into the ray tracing software. The base beam shaper surface can be polished conventionally and the scattering function applied on the base surface. However, the preferred implementation is to manufacture a Fresnel surface using the same small, preferably four to ten micron square facets, that are required for the scattering.

For the Fresnel surface, each base facet tilt redirects the chief ray for that facet (i.e. one that starts at the center of the source to and goes to the center of said facet) to the image of the source. The Fresnel facet tilt is added to that scattering tilt, as described below. Using a Fresnel base surface simplifies the manufacture of the scattering pixels, because the substrate is not curved, standard lithographic processing can be used.

In order to illuminate the desired region at the mask, the pupil (i.e. the beam shaper surface) is divided into many small facets. Each facet directs light to a different portion of the illumination field. This engineered scattering surface allows the illumination of arbitrarily shaped regions. With sufficiently small facets, each point in the illumination field can receive light from thousands or millions of points distributed randomly over the pupil. The random distribution.in the pupil ensures the angular distribution of the radiation or radiant intensity at each point on the reticle is substantially the same. The deviation of each facet from the base surface is determined by focal length of the remaining conventional optical surfaces and the paraxial imaging equation.

Referring to FIGS. 1 and 2, the illumination system 10 of the present invention illuminates a reticle with an image of a predetermined illumination field or area having desired irradiance and a desired angular distribution. This illumination is desirable for photolithographic applications. Additionally, the illumination system 10 of the present invention increases the étendue of the electromagnetic radiation source by evenly distributing the available power across the illumination field or arcuate area. The étendue of an optical system is a geometrical quantity related to the cross sectional area of the source and the angular subtents collected by the aperture. Laser plasma and capillary discharge sources are generally small, less than approximately one millimeter. Synchrotrons have small angular extends, which must be taken into account in the design process. As a result, it is often necessary to increase the étendue of the source. The present invention achieves a desired illumination pattern, a desired angular distribution, and high efficiency, all in a compact package. The present invention is preferably applicable to irradiate a portion of a ring field or arcuate region of a projection optic with extreme ultraviolet electromagnetic radiation. One such projection optic system is disclosed in U.S. Pat. No. 5,815,310 entitled "High Numerical Aperture Ring Field Optical Reduction System" issuing to Williamson on Sep. 29, 1998, which is herein incorporated by reference in its entirety.

Referring to FIGS. 1 and 2 illustrating the illumination system 10 of the present invention, a relatively small source 12, such as a laser plasma source or a capillary discharge tube emits electromagnetic radiation with the desired wavelength in the extreme ultraviolet region. The collector or first non-imaging optic element collects the energy or electromagnetic radiation and forms a desired irradiance distribution provided to the shaper or second non-imaging optic 18. The non-imaging surfaces of the non-imaging optic elements are the solution to differential equations. These differential equations are well known to those skilled in the art and are disclosed in a book entitled "Computer Aided Optical Design of Illumination and Irradiating Devices" by Kusch, and published by Aslan Publishing House, Moscow, 1993. Using equations found in this book non-imaging optic elements are readily designed for point sources with rotationally symmetric angular intensity and rotationally symmetric pupil fills. For a finite sized source and non-rotationally symmetric systems more general equations may be used. Such equations are well known to those skilled in the are and may be found in an article entitled "Formulation of a Reflector-Design Problem for a Lighting Fixture" by J.

S. Schruben published in the Journal of the Optical Society of America, Vol. 62, No. 12, December 1972 and in an article entitled "Tailored Reflectors for Illumination" by D. Jenkins and R. Winston published in Applied Optics, Vol. 35, No. 10, April 1996. The reflectivity of the coatings and the angular intensity distribution of the source are both taken into account when designing the non-imaging optic surfaces. The base surface of second non-imaging optic element 18 is non-imaging and collimates electromagnetic radiation from the first non-imaging optic element 14 so as to be reflected by the second non-imaging optic element 18 in a parallel bundle. On the surface 32 of the second non-imaging optic element 18 is formed an array of facets shaped and tilted such that the angular spectrum reflected from the second non-imaging optic element 18 forms the desired shape at the reticle or mask when imaged by the remaining conventional optics 22 and 26 of the present invention. The second non-imaging optical element 18 may be fabricated using lithographic techniques.

Figure 3:
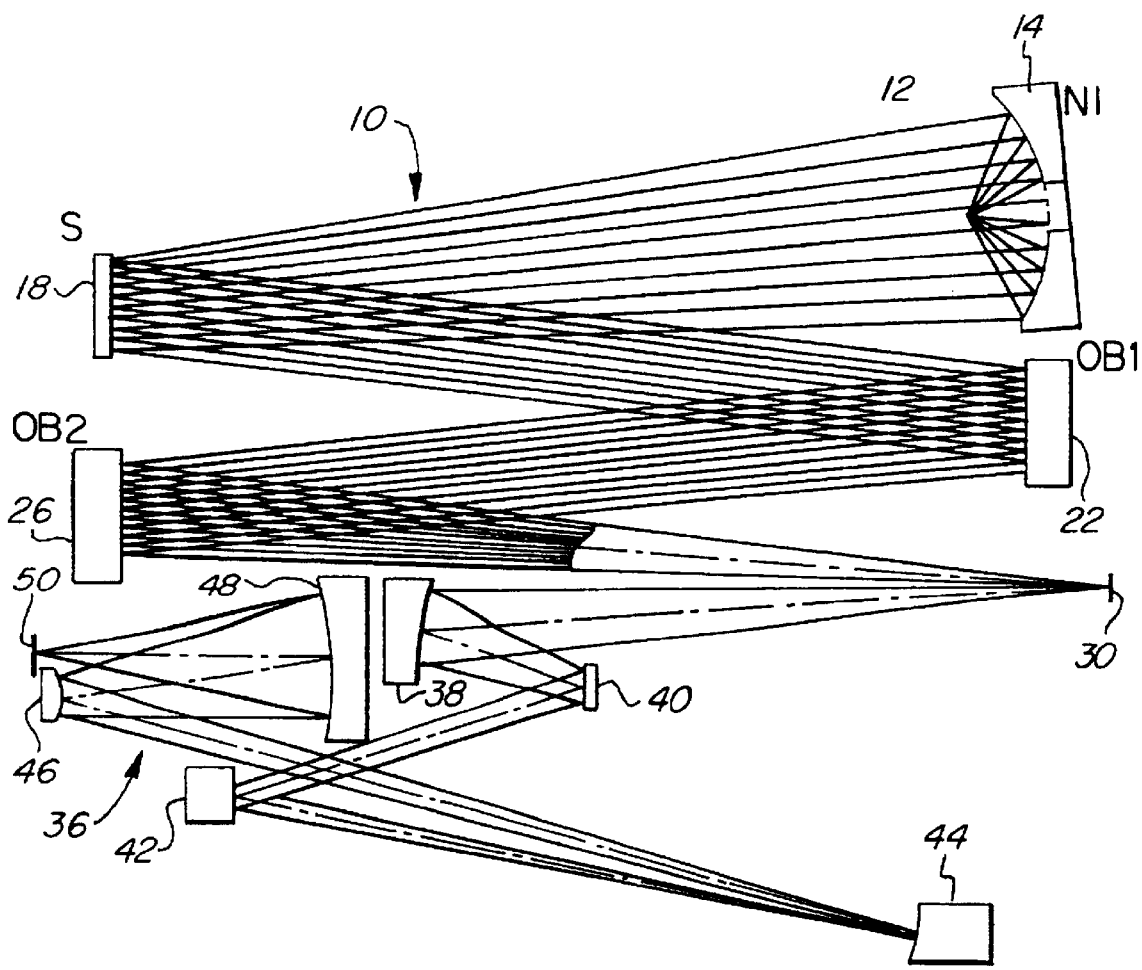
FIG. 3 schematically illustrates the illumination system illustrated in FIG. 1 in combination with a projection optic.

FIG. 3 illustrates the extreme ultraviolet illumination system 10, as illustrated in FIGS. 1 and 2, in combination with an extreme ultraviolet projection optic 36, such as that disclosed in U.S. Pat. No. 5,815,310. Illumination system 10 provides a desired irradiance and a desired angular distribution in a predetermined illumination field, such as a portion of a ring field or arc, for illuminating the reticle 30. Reticle 30 is a reflective reticle. As a result, the electromagnetic radiation strikes the reticle 30 slightly off axis with respect to a line normal to the reticle 30. The electromagnetic radiation is collected and reflected by a first mirror 38, which is collected and reflected by a second mirror 40, which is collected and reflected by a third mirror 42, which is collected and reflected by a fourth mirror 44, which is collected and reflected by a fifth mirror 46, which is collected and reflected by a sixth mirror 48, which projects the image of the reticle onto a photosensitive substrate 50. Sufficient clearance is provided between the EUV illumination system 10 and the projection optic 36 to permit the reticle 30 and the photosensitive substrate 50 to be scanned in a parallel direction such that the illumination field projects the image of the reticle over a predetermined area of the photosensitive substrate. The reticle 30 and the photosensitive substrate 50 are positioned for parallel scanning. All of the optical elements are positioned to not interfere with any needed stages for the movement of the reticle 30 and photosensitive substrate 50. Accordingly, the entire system, illumination system 10 and projection optic 50, are preferably positioned entirely between the reticle 30 and the substrate 50.

Figure 4A:
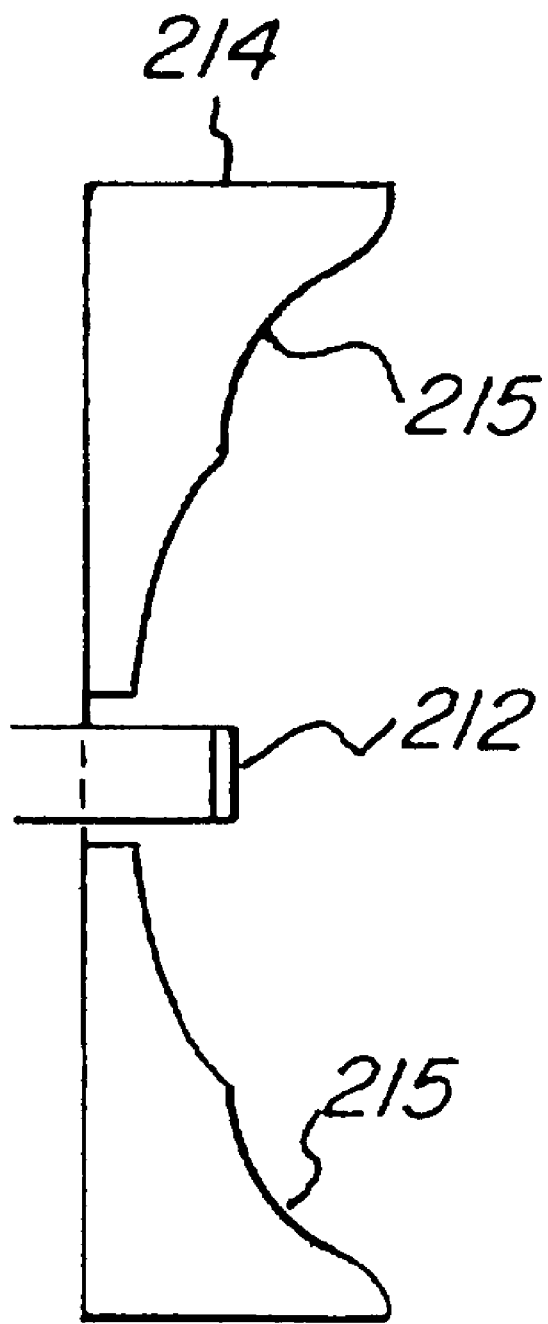
FIG. 4A schematically illustrates an embodiment of the non-imaging optic element used to form a desired irradiance distribution.

FIG. 4A schematically illustrates the profile of a collector or first non-imaging optical element 214. The collector or first non-imaging optical element 214 may be axially symmetrical. The collector or non-imaging optic element 214 has a curved reflective surface 215. The curved reflective surface 215 is calculated or determined based upon the desired irradiance distribution at the pupil. A relatively small EUV source 212 is positioned near the origin of the non-imaging optical element 214. The electromagnetic radiation from the source 212 is collected and reflected by the first non-imaging optical element 214. The reflected electromagnetic radiation forms a desired irradiance distribution.

Figure 4B:
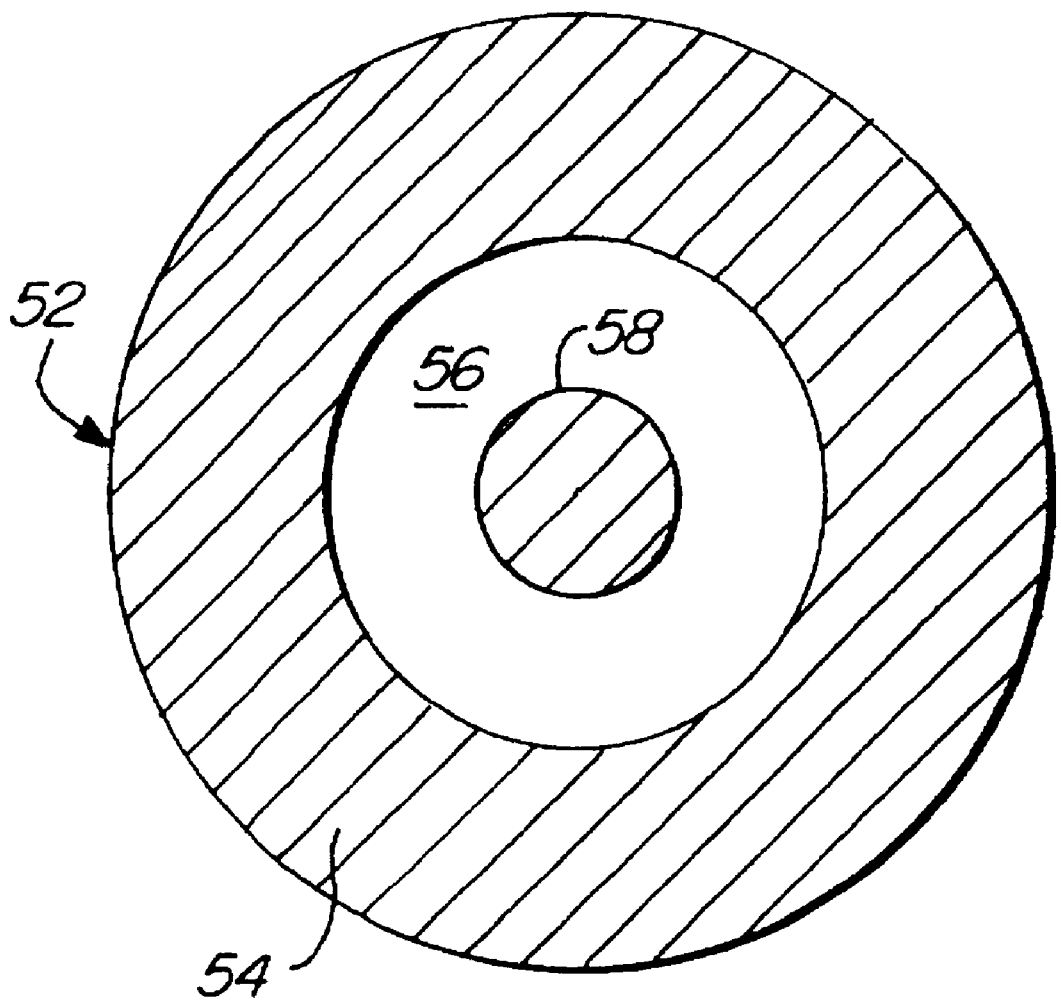
FIG. 4B is a plan view graphically illustrating the desired irradiance distribution formed by the non-imaging optic element illustrated in FIG. 4A.

FIG. 4B graphically illustrates one such irradiance distribution. An annular irradiance distribution 52 is illustrated. The annular irradiance distribution 52 is characterized by a surrounding dark field 54 with a contained annular illumination 56 and dark center 58. While an annular irradiance distribution 52 has been illustrated, any desired irradiance distribution may be obtained depending upon the calculated profile or shape of surface 215 of the non-imaging optical element 214. For example, top hat, quadrupole, uniform or other know desired irradiance distribution.

Figure 5A:
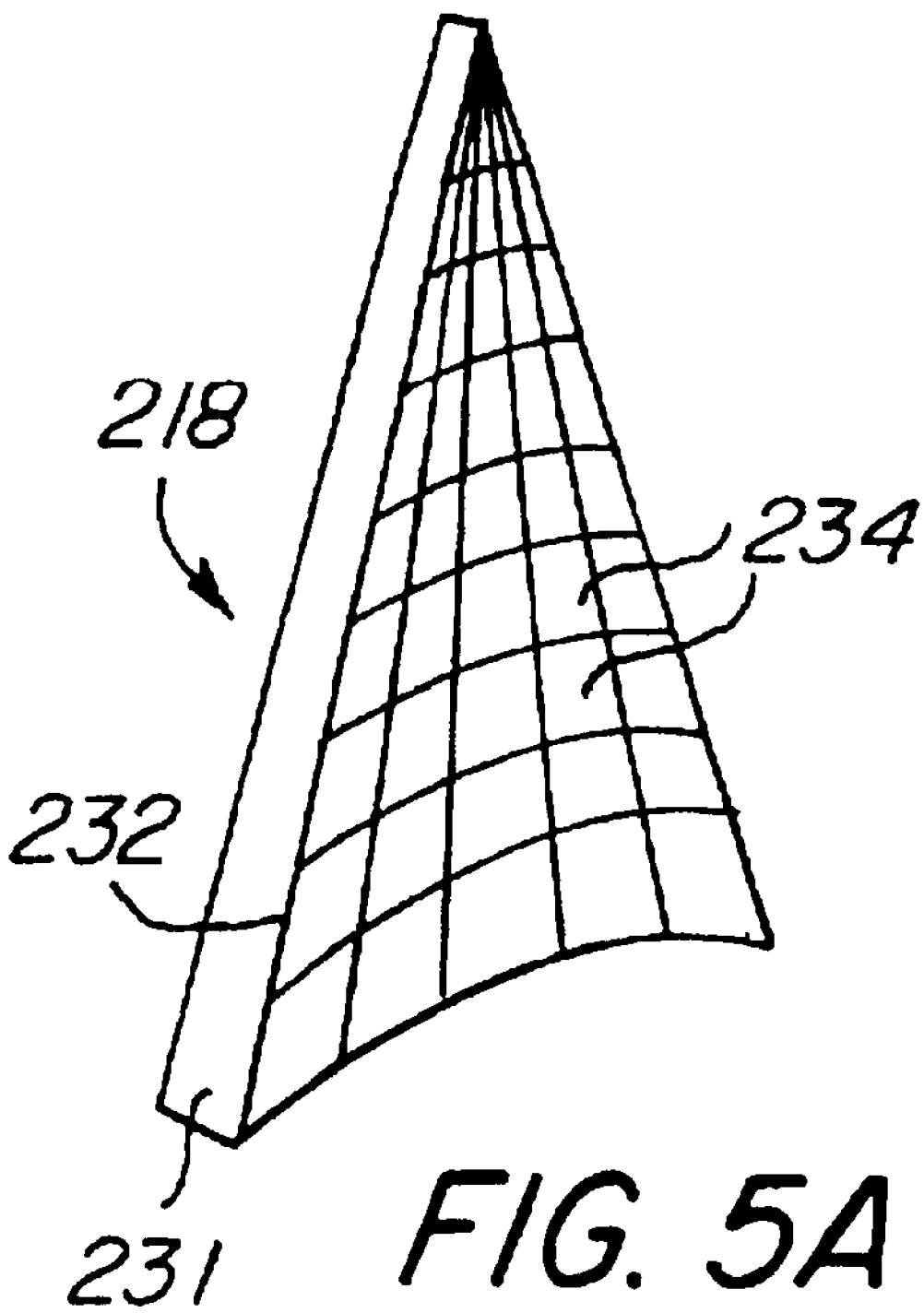
FIG. 5A schematically illustrates an embodiment of the non-imaging optic element in the shape of an axicon used to redirect the electromagnetic radiation into collimated nearly spherical or flat wave fronts and an illumination field or area having a desired shape.

FIG. 5A illustrates a shaper or second non-imaging optical element 218. The second non-imaging optical element 218 is another embodiment of the second non-imaging optical element 18 illustrated in FIGS. 1 and 2. The second non-imaging optic element 218 is formed on a substrate or base 231. The base 231 has a surface 232. The surface 232 may have a shape of a Fresnel axicon. While FIG. 5A illustrates the second non-imaging optic element 218 as a conical section, the conical surface of an axicon may be placed on a conventional round lens for mounting. While FIG. 5A illustrates an axicon, it should be appreciated that the second non-imaging optical element 218 may have other shapes depending upon the source and desired irradiance or angular distribution. For example, if angular distribution of the source and the pupil fill is rotationally symmetric, the second non-imaging optic element has a shape of an odd-asphere. When there is no rotational symmetry, the second non-imaging optic element will have an unusual shape. The unusual shape is determined to provide the function of collimating the rays. The surface 232 has a plurality of reflective angled or tilted facets 234 thereon. The surface 232 in combination with the plurality of facets 234 shape or redirect the electromagnetic radiation collimating it and forming spherical or flat wavefronts having a uniform illumination over a desired illumination area or field. The second non-imaging optical element 218 may have a relatively large number of reflective facets 234, with each facet 234 having a dimension of approximately ten to four micrometers. While ten to four micrometers is the most useful range of facet sizes, smaller and larger facets would also work. The angle or tilt of each facet 234 is calculated to provide an arcuate illumination area or field with uniform illumination and the desired irradiance distribution. The facets 234 may be made by etching or other photolithographic techniques. The uniform illumination has a desired irradiance distribution created by the collector or first non-imaging optical element 14 or 214 illustrated in FIGS. 1, 3, and 4A.

Figure 5B:
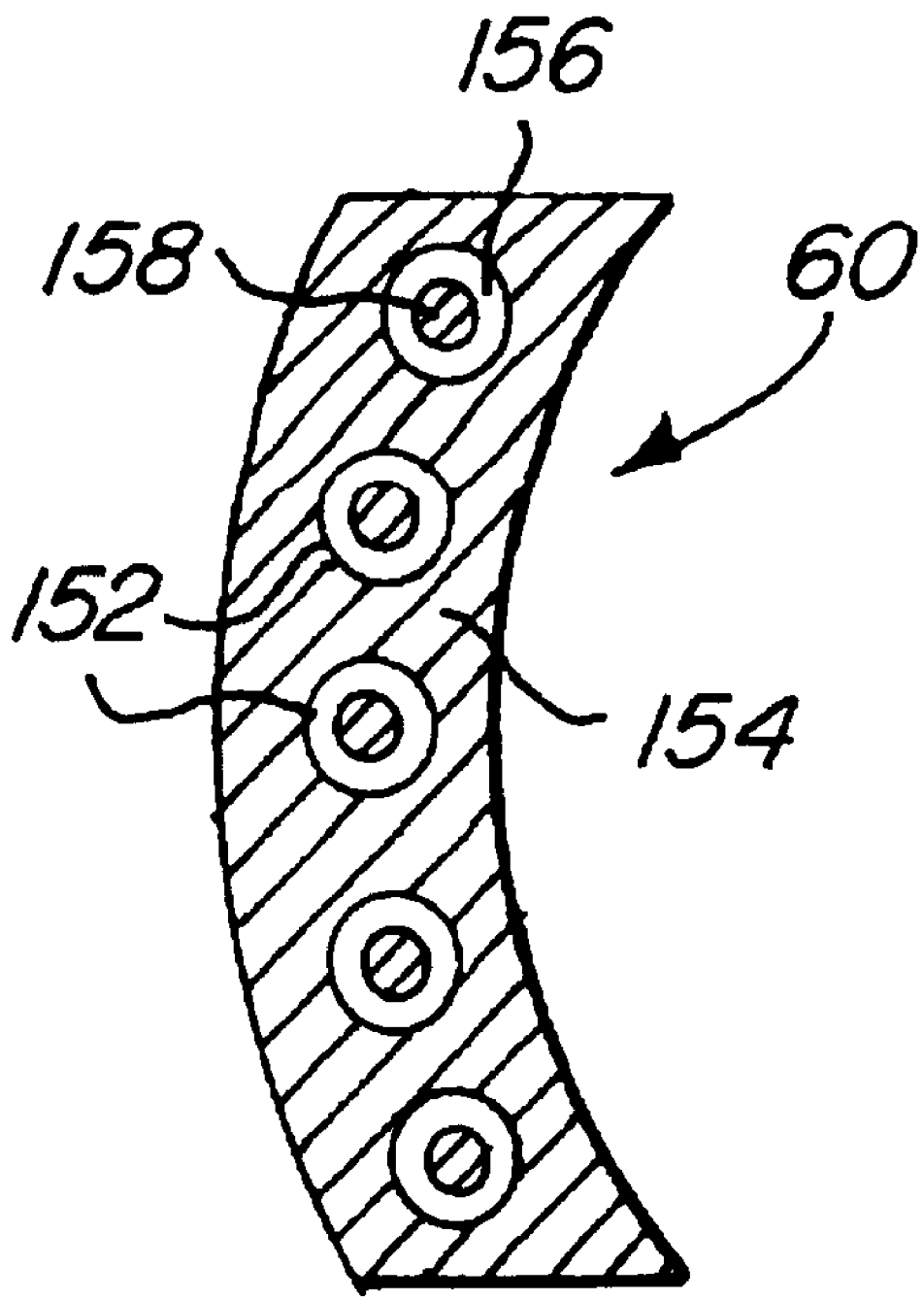
FIG. 5B is a plan view graphically illustrating the desired irradiance and angular distribution having a desired arcuate illumination field or area formed by the non-imaging optic element illustrated in FIG. 5A.

FIG. 5B graphically illustrates a desired illumination area or field 60 having an arcuate shape. Additionally, graphically illustrated is an annular angular distribution 152. The annular angular distribution 152 has a dark field 154 surrounding an annular illumination 156 and dark center 158. While the annular angular distribution has been graphically illustrated, it will be understood by those skilled in the art that the angular distribution appears annular from any point in the illumination area or field. Therefore, the illumination area or field is uniformly illuminated with annular irradiance and angular distribution.

Figure 5C:
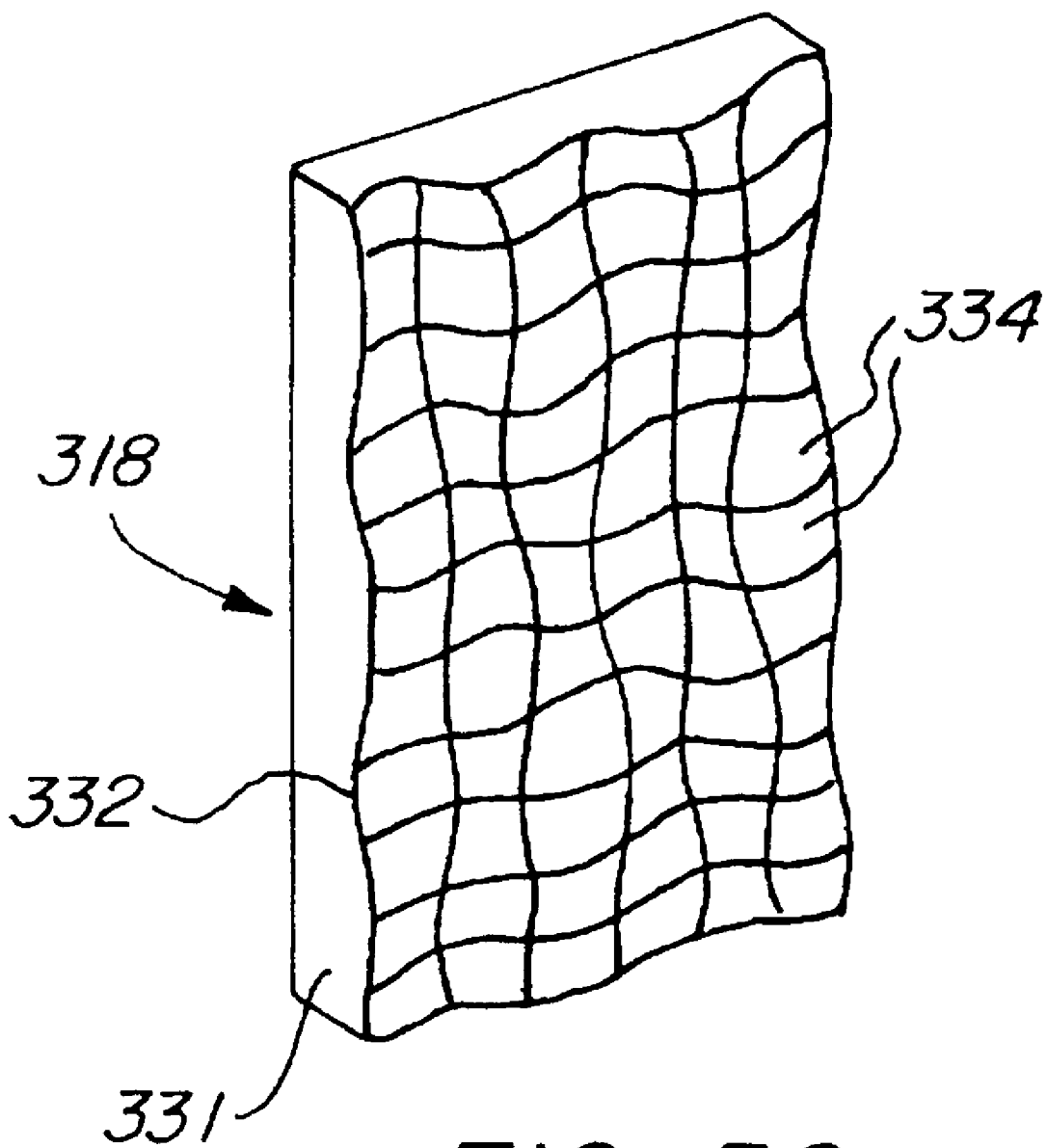
FIG. 5C schematically illustrates an embodiment of the non-imaging optic element having a shape used to redirect the electromagnetic radiation into collimated nearly spherical or flat wave fronts and an illumination field or area having a desired shape.

FIG. 5C is a perspective view illustrating another embodiment of the second non-imaging optical element. In this embodiment the non-imaging optical element 318 has a base 331 with a base surface 332 formed thereon. The base surface 332 may have an unusual shape. The unusual shape is determined to provide the function of collimating the rays. Reflective facets 334 are formed on the base surface 332. The position and tilt of the facets 334 are determined so as to provide a desired illumination over a desired illumination field.

Figure 5D:
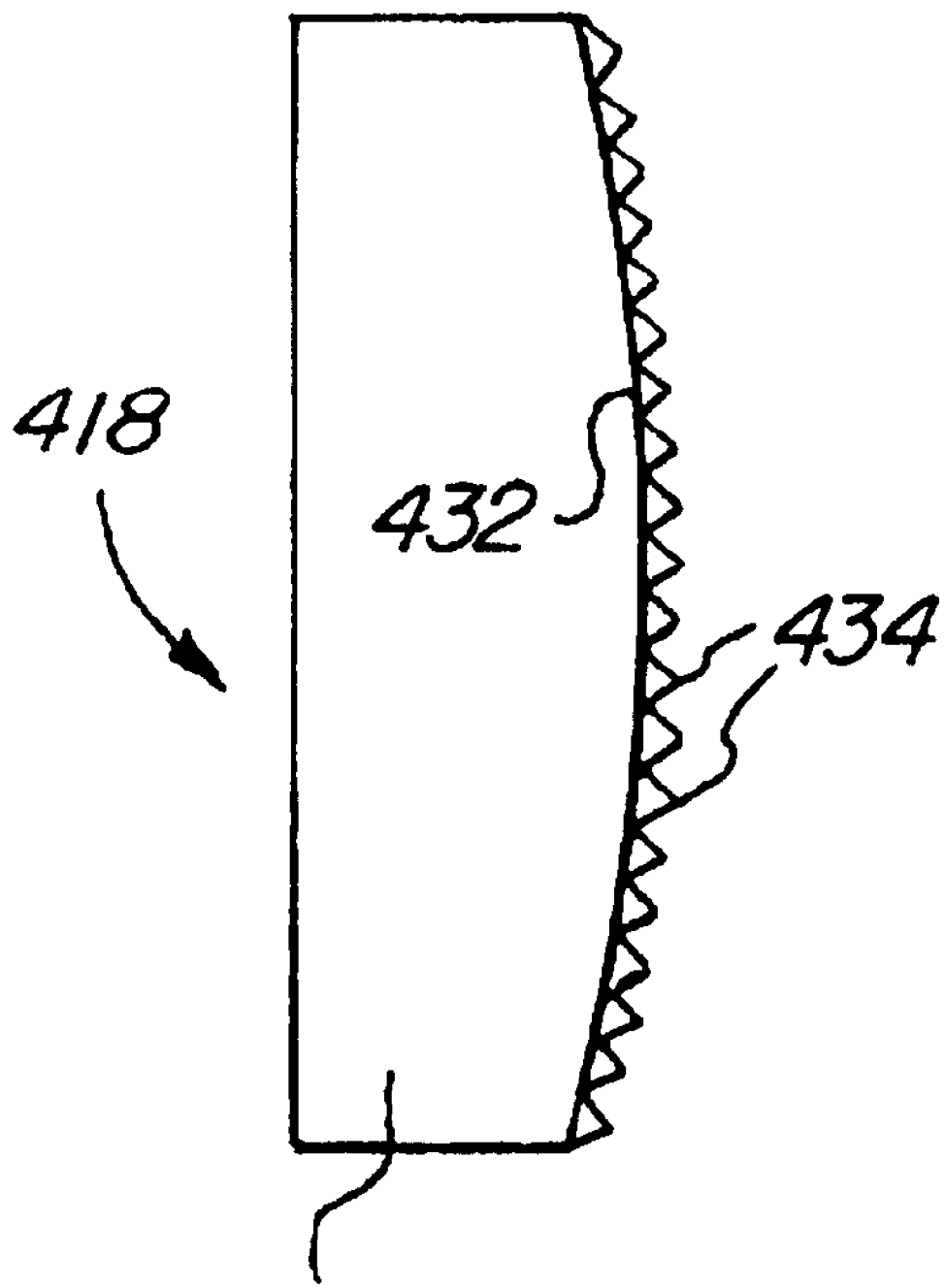
FIG. 5D is an elevational view graphically illustrating a non-imaging optical element having an odd asphere shaped base surface and Fresnel facets.

FIG. 5D is an side elevational view illustrating another embodiment of the second non-imaging optic element. In this embodiment the second non-imaging optic element 418 has a base 431 with a base surface 432 having the shape of an odd asphere. An odd asphere is a surface whose sag can be written as a function of the radial distance on the vertex plane, the locus of points $(x, y, z(r))$, where $r=(X^2+y^2)^{1/2}$. An axicon is a special case of an odd asphere. An odd asphere is non-imaging because it does not image points to points at any conjugates. For this reason, the first non-imaging optic element or collector may also be an odd ashpere. On base surface 432 are placed facets 434. The facets are positioned so as to provide a desired illumination over a desired area or illumination field.

Figure 5E:
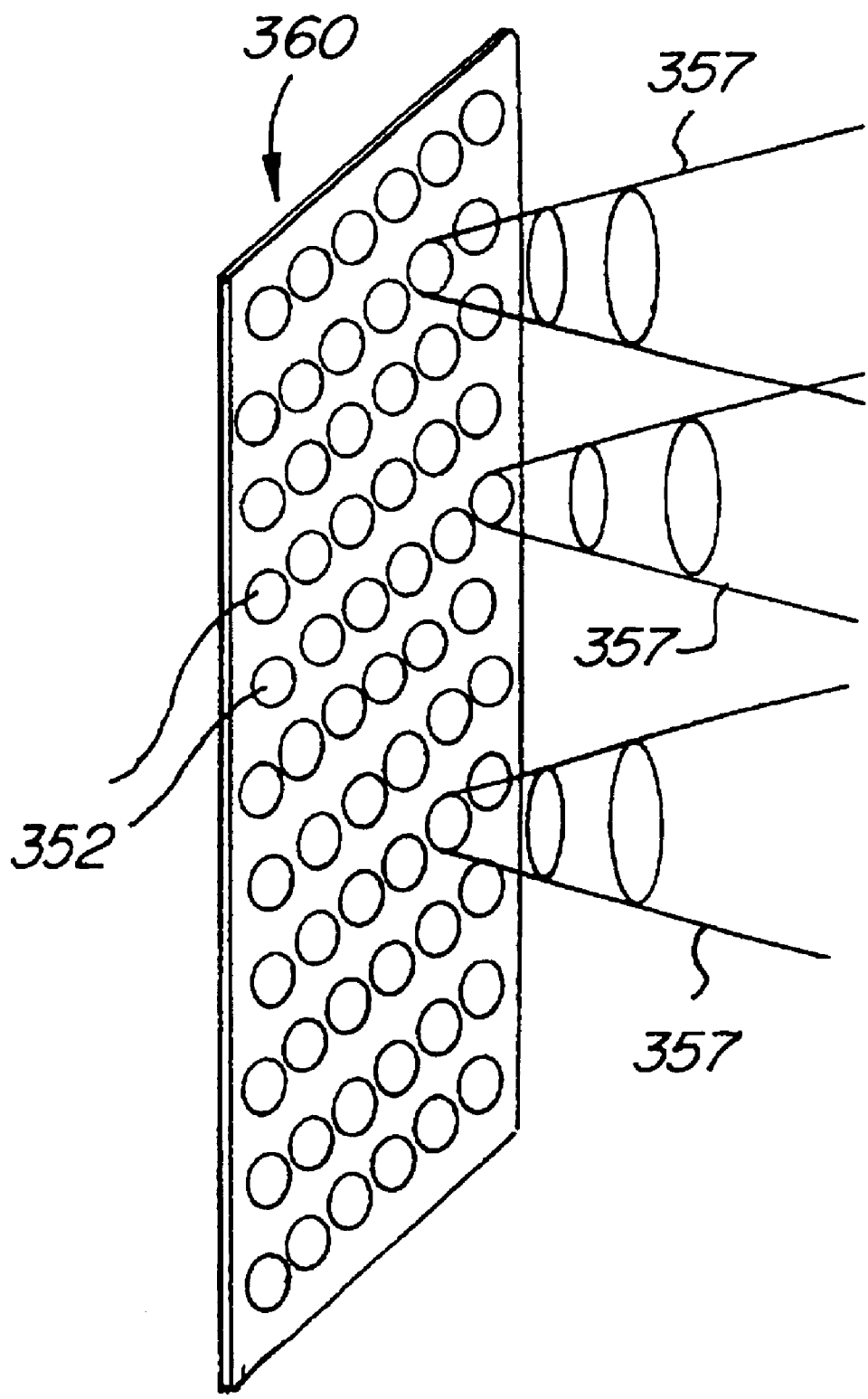
FIG. 5E is a perspective view graphically illustrating the desired irradiance and angular distribution having a desired rectangular illumination field or area formed by a non-imaging optic element.

FIG. 5E is a perspective view schematically illustrating a rectangular illumination field 360. The illumination field or area 360 has a desired irradiance distribution and desired angular distribution or radiant intensity. Irradiance distribution is commonly expressed in Watts per meter squared. It is important to realize that the radiant intensity looking back from the reticle or illumination field to the pupil from each field point, will not necessarily be the same as the irradiance distribution in the pupil. The illumination field 360 is graphically illustrated with a uniform irradiance distribution 352. Several illumination cones 357 are illustrated, but it should be appreciated that the illumination cones 357 as well as the uniform irradiance distribution 352 are across the entire illumination field 360. Accordingly, a desired irradiance distribution may be obtained with a desired pupil fill or radiant intensity in any desired shape of illumination field.

Figure 6:
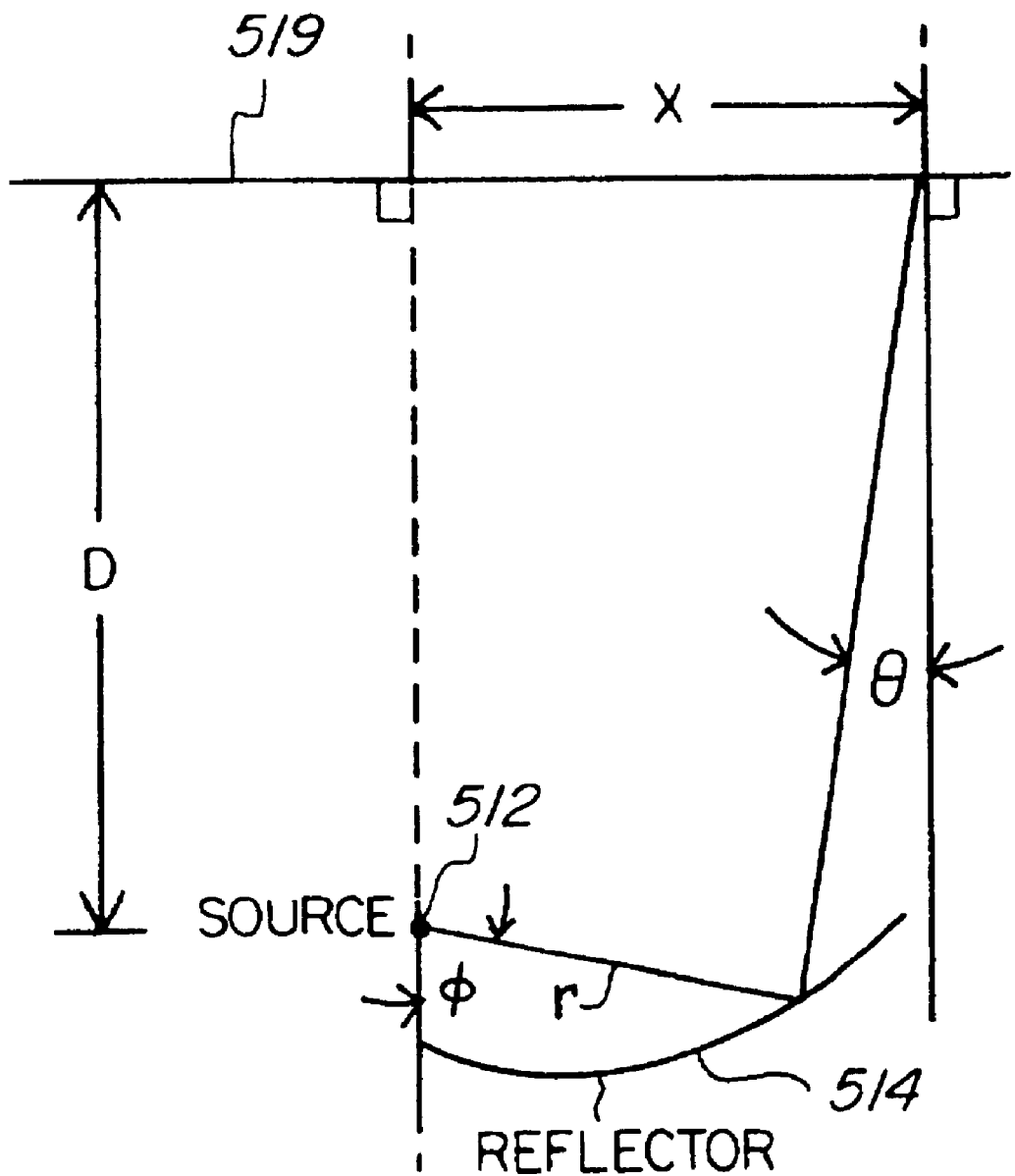
FIG. 6 graphically illustrates parameters utilized in calculating reflective surfaces of the non-imaging optic elements.

FIG. 6 graphically illustrates the parameters utilized to determine or define the surface of a non-imaging optic element. Point 512 represents a source, line 514 represents a reflector surface, and line 519 represents the illumination plane. The non-imaging optic element may be defined by differential equations which relate the angular distribution of the point source to an arbitrary output irradiance distribution. By non-imaging it is meant an optical element that does not have a finite number of foci. A system of differential equations define the surface. The solution suitable for determining the surface of the non-imaging optic element, such as that illustrated in FIG. 1 as elements 14 and 18 or 214, 218, 318, and 418 in FIGS. 4A, 5A, 5C, and 5D may be obtained by referring to the following differential equations:

$$\frac{d\varphi}{dx} = \pm \frac{xE(x)}{\rho(\alpha)/(\varphi)\sin(\varphi)}$$

$$\frac{dr}{d\varphi} = \frac{d\varphi}{dx} r\tan(\alpha)$$

where;
  E(x) is irradiance;
  ρ is the reflectance;
  I(φ) is the intensity;
  r is a radial distance between a source and the non-imaging optical element reflective surface;
  φ is an angle between the radial distance r and a perpendicular line from an illumination plane extending through the source;
  θ is an angle between a perpendicular line from an illumination plane and a ray reflected from the non-imaging optical element reflective surface;
  x is the distance along an illumination plane from the intersection of the illumination plane and a perpendicular line extending through the source and a ray reflected from the non-imaging optical element reflective surface, and

α=(φ−θ)/2

Additionally, referring to FIG. 6, x=r sin(φ)+tan(θ)[r cos(φ)+D]

Accordingly, many desired rotationally symmetric irradiance distributions may be achieved by the fabrication of a reflective surface defined by the above differential equations. The reflective surface determined to produce the desired irradiance distribution forms the first non-imaging optic element. Accordingly, the image of the source is not formed. By non-imaging it is meant that the image of the source is not formed by the non-imaging optic element. Therefore, by solving the above differential equations, a reflector or collector can be described by an interpolating function, assuming a point source, which can accommodate any irradiation distribution as long as x(φ) increases with φ. As can be appreciated from the above equations, the reflectance of the EUV coatings can be utilized to create the desired irradiance distribution. The second non-imaging optic, element 18 in FIGS. 1 and 3 and elements 218, 318, and 418 in FIGS. 5A, 5C, and 5D, is used to redirect the incident radiation such that it fills the illumination area or field when imaged by the remaining conventional optical elements.

Figure 7A:
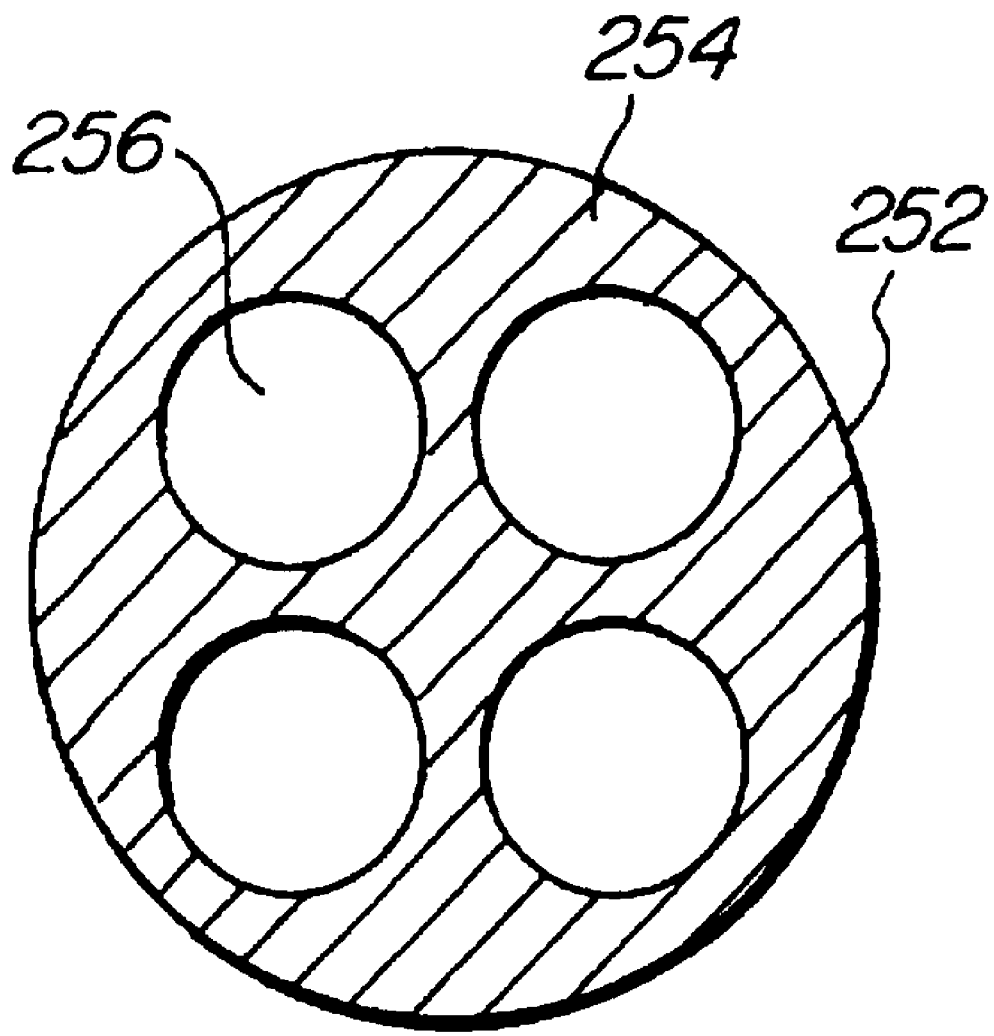
FIG. 7A is a plan view illustrating a desired irradiance and angular distribution used in photolithography, and referred to as quadrupole.
Figure 7B:
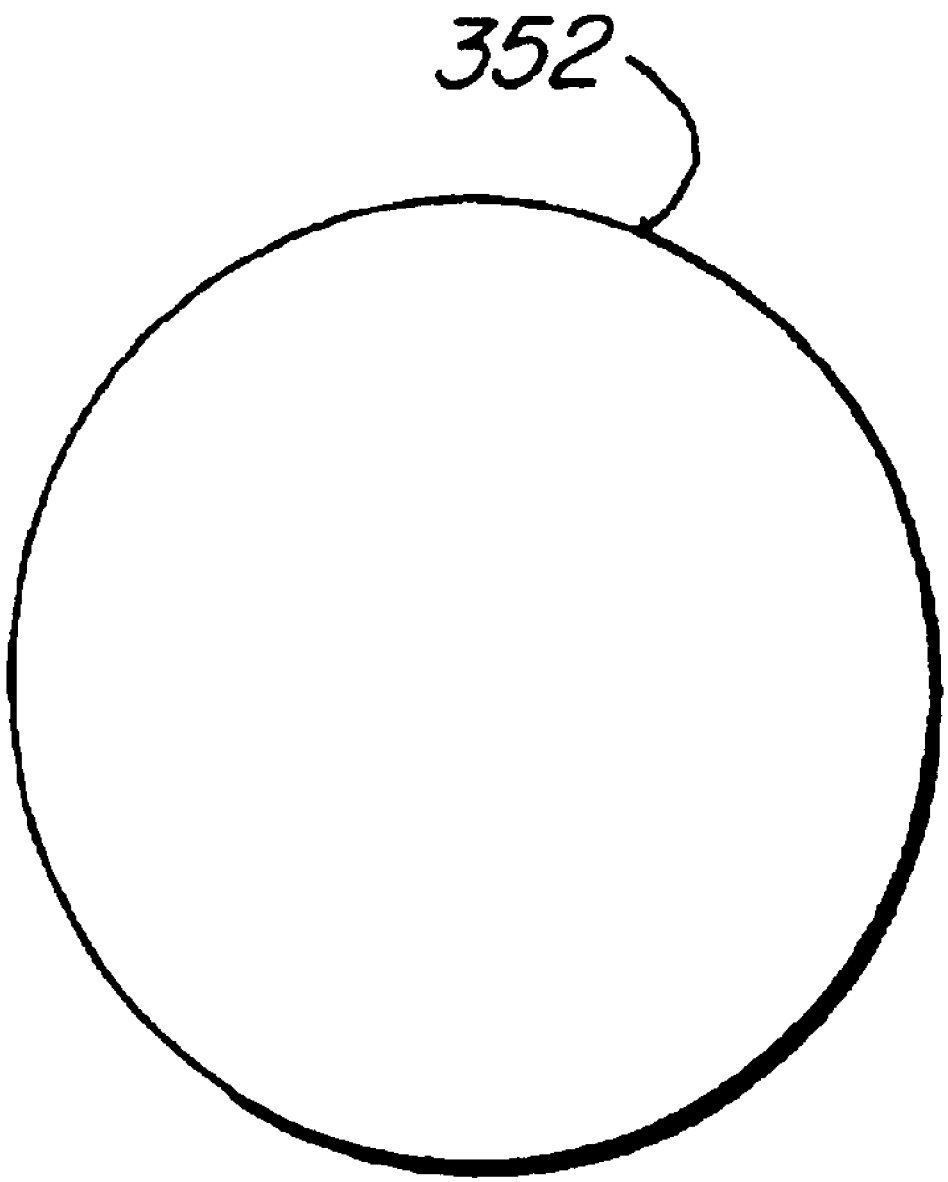
FIG. 7B is a plan view illustrating a desired irradiance and angular distribution used in photolithography, and referred to as uniform.

FIGS. 7A–B illustrate various radiance distributions desirable for use in photolithography depending upon the dominant characteristics of the intended pattern being reproduced. FIG. 7A graphically illustrates a quadrupole radiance distribution 254. The quadrupole radiance distribution has a dark field 254 and four illumination fields 256. FIG. 7B graphically illustrates a uniform radiance distribution 352.

Accordingly, the present invention, by using a first non-imaging optic element to provide the desired irradiation distribution in combination with a second non-imaging optic element to provide nearly spherical or flat wavefronts or collimated electromagnetic radiation permits the use of conventional optical surfaces in the remainder of the illumination system. This makes possible a desired irradiance having desired angular distribution. Additionally, the use of facets placed at the pupil or stop-and preferably on the second non-imaging optic element provides uniform illumination over the desired illumination field. While the facets may be transmissive, they are preferably reflective and placed on the surface of the second non-imaging optic element. Refractive or transmissive elements may unduly attenuate or absorb the EUV electromagnetic radiation. The present invention also permits a change in numerical aperture by masking the pupil or changing the first and second non-imaging optical elements. This provides a desired sigma or coherence, ratio of numerical apertures, for the system.

Additionally, although the preferred embodiment has been illustrated and described, it will be obvious to those skilled in the art that various modifications may be made without departing from the spirit and scope of this invention.

What is claimed:

1. An extreme ultraviolet condenser comprising:
   a first non-imaging optic element, reflecting electromagnetic radiation;
   a second non-planar non-imaging optic element, positioned to receive the electromagnetic radiation reflected from said first non-imaging optic element; and
   a faceted optic element positioned near a stop of the condenser,
   whereby electromagnetic radiation from a source is condensed into a desired illumination area having a predetermined radiance and angular distribution.

2. An extreme ultraviolet condenser as in claim 1 wherein:
   said faceted optic element is formed on said second non-planar non-imaging optic element.

3. An extreme ultraviolet condenser as in claim 1 wherein:
   said first non-imaging optic element has varied reflectance.

4. An extreme ultraviolet condenser as in claim 1 further comprising:
   at least two reflective optical elements positioned to receive electromagnetic radiation from said non-planar faceted optical element.

5. An extreme ultraviolet condenser as in claim 4 wherein:

said at least two reflective optical elements image the desired illumination area onto a reflective reticle.

6. An extreme ultraviolet condenser as in claim 4 wherein:

said at least two reflective optical elements comprises anamorphic aspheres.

7. A condenser for use in an extreme ultraviolet wavelength region comprising:

a collector having a predetermined reflective surface which does not image a source and provides a predetermined radiance distribution;

a non-planar shaper, said non-planar shaper receiving electromagnetic radiation reflected from said collector and shapes the electromagnetic radiation into a collimated illumination field of desired shape;

a plurality of facets formed on said non-planar shaper, said plurality of facets providing a desired radiance within the illumination field; and objecticve optics forming an image of the illumination field on a reticle.

8. A condenser for use in the extreme ultraviolet wavelength region as in claim 7 wherein:

said non-planar shaper is a non-imaging optic element.

9. A condenser for use in the extreme ultraviolet wavelength region as in claim 7 wherein:

said non-planar shaper has an odd asphere shaped surface.

10. A condenser for use in the extreme ultraviolet wavelength region as in claim 7 wherein:

said non-planar shaper is a fresnel axicon.

11. A condenser for use in the extreme ultraviolet wavelength region as in claim 7 wherein:

each of said plurality of facets are reflective.

12. A condenser for use in the extreme ultraviolet wavelength region as in claim 11 wherein:

each of said plurality of facets has a surface dimension of at least four micrometers.

13. A condenser for use in the extreme ultraviolet wavelength region as in claim 7 wherein:

said objective optics comprise anamorphic aspheres.

14. A condenser for use in the extreme ultraviolet wavelength region as in claim 7 wherein:

said collector has varied reflectance.

15. A condenser for use in an extreme ultraviolet illumination system comprising:

non-imaging means for collecting electromagnetic radiation from a source and forming a desired radiance distribution;

non-planar shaper means, positioned to receive electromagnetic radiation from said non-imaging means, for collimating the electromagnetic radiation and forming an illumination field having a desired shape; and facet means, associated with said non-planar shaper means, for forming a uniform illumination over the illumination field.

16. A condenser for use in an extreme ultraviolet illumination system as in claim 15 further comprising:

objective means, positioned to receive electromagnetic radiation from said facet means, for imaging the desired illumination field onto a reticle.

17. A condenser for use in an extreme ultraviolet illumination system as in claim 15 wherein:

said non-planar shaper means has a surface with an odd asphere shape.

18. A condenser for use in an extreme ultraviolet illumination system as in claim 15 wherein:

said non-planar shaper means comprises an axicon.

19. A condenser for use in an extreme ultraviolet illumination system as in claim 18 wherein:

the axicon comprises fresnel axicon.

20. A condenser for use in an extreme ultraviolet illumination system as in claim 15 wherein:

said facet means comprises a plurality of reflective facets formed on said non-planar shaper means.

21. A condenser for use in the extreme ultraviolet wavelength region comprising:

a collector having a predetermined reflective surface providing a predetermined radiance distribution, said collector having the predetermined reflective surface defined by the following differential equations:

$$\frac{d\varphi}{dx} = \pm \frac{xE(x)}{\rho(\alpha)\sin(\varphi)}$$

$$\frac{dr}{d\varphi} = \frac{d\varphi}{dx} r \tan(\alpha)$$

where,

E(x) is radiance,

ρ is the reflectance,

I(φ) is the intensity, r is a radial distance between a source and the non-imaging optical element reflective surface, φ is an angle between the radial distance r and a perpendicular line from an illumination plane extending through the source, θ is an angle between a perpendicular line from an illumination plane and a ray reflected from the non-imaging optical element reflective surface, x is the distance along an illumination plane from the intersection of the illumination plane and a perpendicular line extending through the source and a ray reflected from the non-imaging optical element reflective surface, and

α=(φ−θ);

a non-planar shaper, said non-planar shaper receiving electromagnetic radiation reflected from said collector and shaping and collimating the electromagnetic radiation into an illumination field having a desired shape;

a plurality of facets formed on said non-planar shaper, said plurality of facets providing a desired radiance within the illumination field; and objective optics forming an image of the desired illumination field on a reticle.

22. A condenser for use in the extreme ultraviolet wavelength region as in claim 21 wherein:

said non-planar shaper is an axicon having a conical surface and said plurality of facets are formed on the conical surface.

23. A condenser for use in the extreme ultraviolet wavelength region as in claim 22 wherein:

each of said plurality of facets has a surface dimension of at least four micrometers.

24. A condenser for use in the extreme ultraviolet wavelength region as in claim 21 wherein:

said objective optics comprises a reflective substantially flat optic element and a reflective oblate spheroid optic element.

25. A condenser for use in the extreme ultraviolet wavelength region as in claim 21 wherein:
said objective optics comprises anamorhic aspheres.

26. An illumination system for use in photolithography using electromagnetic radiation in an extreme ultraviolet wavelength region comprising:
a source of electromagnetic radiation, the electromagnetic radiation having a wavelength less than two hundred nanometers;
a non-imaging collector positioned to receive the electromagnetic radiation from said source, said non-imaging collector having a shaped reflective surface reflecting electromagnetic radiation creating a predetermined radiance distribution;
a non-planar shaper positioned to receive the electromagnetic radiation reflected from said non-imaging collector, said non-planar shaper collimating the electromagnetic radiation and forming an illumination field having a predetermined shape; and
objective optics positioned to receive the electromagnetic radiation from said non-planar shaper, said objective optics imaging the illumination field forming a desired radiance with a desired angular distribution,
whereby the image of a reticle is projected onto a photosensitive substrate.

27. An illumination system for use in photolithography using electromagnetic radiation in the extreme ultraviolet wavelength region as in claim 26 wherein:
said non-planar shaper comprises an axicon having a conical surface and a plurality of reflective facets formed on the conical surface.

28. A method of illuminating a reticle with extreme ultraviolet electromagnetic radiation comprising:
forming a desired radiance distribution of electromagnetic radiation with a reflective non-imaging optic element;
collecting the electromagnetic radiation reflected from the reflective non-imaging optical element;
redirecting the electromagnetic radiation collected form the reflective non-imaging optical element forming collimated electromagnetic radiation; and
shaping the electromagnetic radiation with a non-planar shaper such that when imaged a uniform illumination having a desired angular distribution is formed over an illumination field having a desired shape.

29. A method of illuminating a reticle as in claim 28 further comprising:
imaging the illumination field onto a reflective reticle.

30. A condenser for use with extreme ultraviolet electromagnetic radiation and for forming a predetermined illumination field and pupil fill comprising:
a first non-imaging reflective optical element positioned adjacent a source of electromagnetic radiation;
a second non-planar non-imaging optical element having a base surface positioned to receive the electromagnetic radiation reflected from said first non-imaging reflective optical element and collimate the reflected electromagnetic radiation;
a plurality of reflective facets positioned adjacent the base surface of said second non-planar non-imaging optical element, each of said plurality of reflective facets having a shape and tilt such that an angular spectrum reflected forms the predetermined illumination field; and
imaging optics positioned to receive the electromagnetic radiation reflected from said plurality of reflective facets and image the electromagnetic radiation,
whereby the predetermined illumination field and pupil fill are obtained and used to project the image of a reticle onto a photosensitive substrate.

31. A condenser for use with extreme ultraviolet electromagnetic radiation and for forming a predetermined illumination field and pupil fill from a source comprising:
a first reflective optical element positioned adjacent the source of electromagnetic radiation, said first reflective optical element not forming an image of the source;
a second optical element having a base surface positioned to receive the electromagnetic radiation reflected from said first reflective optical element and collimate the reflected electromagnetic radiation;
a plurality of reflective facets positioned adjacent the base surface of said second optical element, each of said plurality of reflective facets having a shape and tilt such that an angular spectrum reflected forms the predetermined illumination field; and
imaging optics positioned to receive the electromagnetic radiation reflected from said plurality of reflective facets and image the electromagnetic radiation,
whereby the predetermined illumination field and pupil fill are obtained and used to project the image of a reticle onto a photosensitive substrate.

32. An extreme ultraviolet condenser comprising:
first optic element, reflecting electromagnetic radiation, said first optic element not having a finite number of foci;
a second optic element, positioned to receive the electromagnetic radiation reflected from said first optic element, said second optic element having a base surface that collimates the electromagnetic radiation; and
a faceted optic element positioned near a stop of the condenser, said faceted optic element having facets shaped and tilted such that the angular spectrum reflected forms a desired shape at an illumination area,
whereby electromagnetic radiation from a source is condensed into the desired illumination area having a predetermined radiance and angular distribution.

33. An illumination system for use in photolithography using electromagnetic radiation in the extreme ultraviolet wavelength region comprising:
a source of electromagnetic radiation, the electromagnetic radiation having a wavelength less than two hundred nanometers;
a collector positioned to receive the electromagnetic radiation from said source, said collector having a shaped reflective surface reflecting electromagnetic radiation creating a predetermined radiance distribution and not having a finite number of foci;
a non-planar shaper positioned to receive the electromagnetic radiatior reflected from said collector, said non-planar shaper collimating the electromagnetic radiation and forming an illumination field having a predetermined shape; and
objective optics positioned to receive the electromagnetic radiation from said non-planar shaper, said objective optics imaging the illumination field forming a desired radiance with a desired angular distribution,
whereby the image of a reticle is projected onto a photosensitive substrate.

* * * * *